United States Patent
Pennycooke et al.

(10) Patent No.: US 10,932,347 B2
(45) Date of Patent: Feb. 23, 2021

(54) INTELLIGENT LIGHTING CONTROL SYSTEM ELECTRICAL CONNECTOR APPARATUSES, SYSTEMS, AND METHODS

(71) Applicant: Racepoint Energy, LLC, Osterville, MA (US)

(72) Inventors: Nicholas David Pennycooke, San Mateo, CA (US); William Lark, Jr., Glendale, CA (US)

(73) Assignee: Racepoint Energy, LLC, Osterville, MA (US)

( * ) Notice: Subject to any disclaimer, the term of this patent is extended or adjusted under 35 U.S.C. 154(b) by 0 days.

(21) Appl. No.: 16/315,441

(22) PCT Filed: Jul. 7, 2017

(86) PCT No.: PCT/US2017/041042
§ 371 (c)(1),
(2) Date: Jan. 4, 2019

(87) PCT Pub. No.: WO2018/009758
PCT Pub. Date: Jan. 11, 2018

(65) Prior Publication Data
US 2019/0239319 A1    Aug. 1, 2019

Related U.S. Application Data

(60) Provisional application No. 62/359,677, filed on Jul. 7, 2016.

(51) Int. Cl.
*H05B 47/18*    (2020.01)
*G05G 1/04*    (2006.01)
(Continued)

(52) U.S. Cl.
CPC ............. *H05B 47/18* (2020.01); *G05G 1/025* (2013.01); *G05G 1/04* (2013.01); *G06F 3/04883* (2013.01);
(Continued)

(58) Field of Classification Search
CPC ............ H05B 37/0254; H05B 37/0272; G06F 3/04883; G05G 1/04; G05G 1/025;
(Continued)

(56) References Cited

U.S. PATENT DOCUMENTS

2004/0051485 A1* 3/2004 Chansky ............ H05B 37/0254
315/362
2008/0272699 A1* 11/2008 Capenos .............. B60Q 1/0088
315/77

(Continued)

FOREIGN PATENT DOCUMENTS

WO    WO-2006029206 A2    3/2006
WO    WO 2015/134987      9/2015
WO    WO-2016079647 A1    5/2016

OTHER PUBLICATIONS

International Search Report and Written Opinion for App. Ser. No. PCT/US2017/041042, dated Sep. 13, 2017, 9 pages.
(Continued)

*Primary Examiner* — Daniel D Chang
(74) *Attorney, Agent, or Firm* — Cesari and McKenna, LLP

(57) ABSTRACT

The present disclosure provides an intelligent lighting control system including an electrical connector interface. The lighting control system includes a module housing, a switch control circuit positioned in the module housing and including a processor configured to modulate a flow of electrical energy to a lighting circuit via a dimmer circuit to produce a plurality of lighting scenes. The lighting control system (Continued)

includes a graphical user interface coupled to the module housing and communicably coupled to the switch control circuit. The lighting control system includes a first electrical connector electrically connected to the switch control circuit and at least one of extending from and recessed in a surface of the module housing. The electrical connector includes a plurality of electrical pins. The first electrical connector is configured for a press fit engagement with a second electrical connector of a base module.

25 Claims, 13 Drawing Sheets

(51) Int. Cl.
    *G05G 1/02*     (2006.01)
    *H03K 17/96*     (2006.01)
    *G06F 3/0488*     (2013.01)
    *H01R 33/76*     (2006.01)
    *H05B 47/19*     (2020.01)

(52) U.S. Cl.
    CPC ........... *H01R 33/765* (2013.01); *H03K 17/96* (2013.01); *H05B 47/19* (2020.01); *G08C 2201/30* (2013.01); *G08C 2201/93* (2013.01); *Y02B 20/48* (2013.01)

(58) Field of Classification Search
    CPC .. H03K 17/96; H01R 33/765; G08C 2201/93; G08C 2201/30; Y02B 20/48
    See application file for complete search history.

(56) References Cited

U.S. PATENT DOCUMENTS

| | | |
|---|---|---|
| 2009/0058707 A1 | 3/2009 | Craze et al. |
| 2011/0035029 A1 | 2/2011 | Yianni et al. |
| 2012/0191257 A1 | 7/2012 | Corcoran et al. |
| 2013/0257315 A1 | 10/2013 | Restrepo et al. |
| 2014/0001952 A1 | 1/2014 | Harris et al. |
| 2014/0252992 A1* | 9/2014 | Radermacher ......... H05B 45/10 315/307 |
| 2015/0163867 A1* | 6/2015 | Recker ............... H05B 37/0272 315/250 |
| 2015/0189726 A1* | 7/2015 | Spira .................. H05B 33/0845 315/302 |
| 2015/0256355 A1 | 9/2015 | Pera et al. |
| 2015/0371534 A1 | 12/2015 | Dimberg et al. |
| 2018/0014388 A1 | 1/2018 | Pennycooket et al. |

OTHER PUBLICATIONS

International Preliminary Report on Patentability for App. Ser. No. PCT/US2017/041042, dated Jan. 17, 2019, 7 pages.

Supplementary European Search Report, Application No. EP 17 82 4951, dated Jan. 24, 2020, 11 pages.

\* cited by examiner

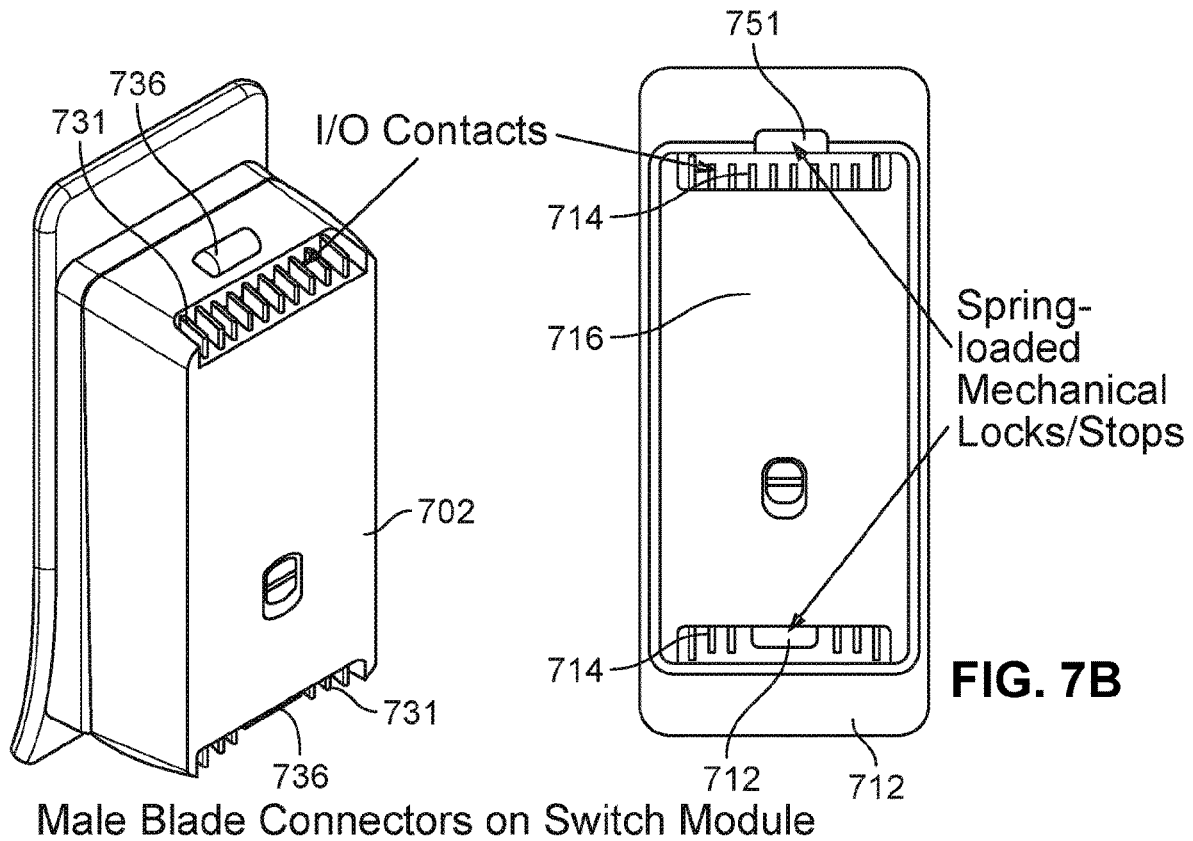
FIG. 7A Male Blade Connectors on Switch Module
FIG. 7B
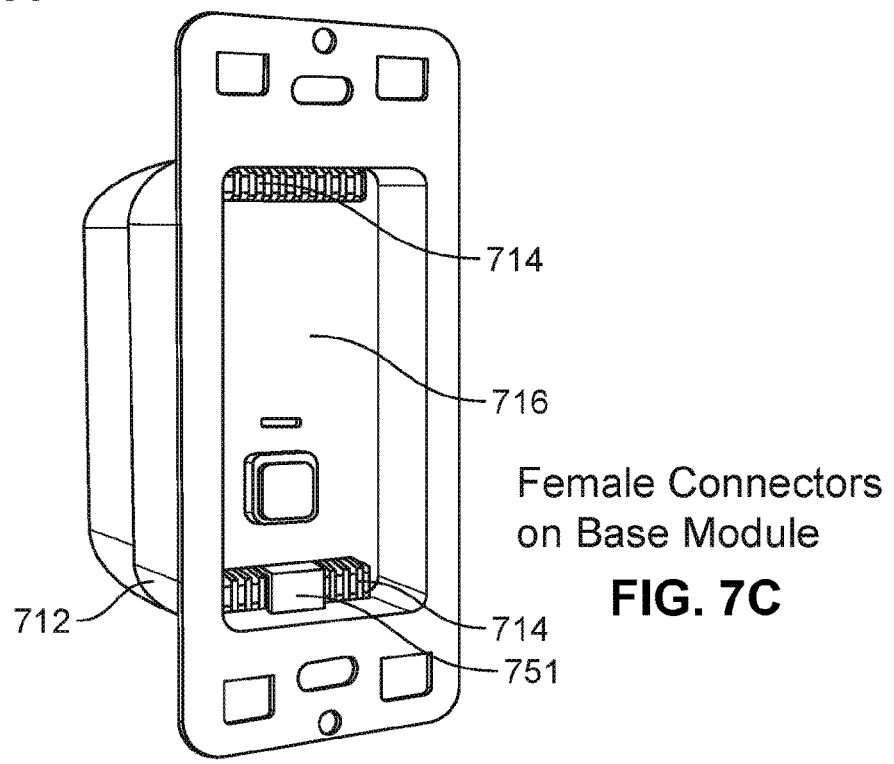
FIG. 7C Female Connectors on Base Module

INTELLIGENT LIGHTING CONTROL SYSTEM ELECTRICAL CONNECTOR APPARATUSES, SYSTEMS, AND METHODS

RELATED APPLICATION

The present application is a National Stage of International Application No. PCT/US2017/041042, filed Jul. 7, 2017 entitled INTELLIGENT LIGHTING CONTROL SYSTEM ELECTRICAL CONNECTOR APPARATUSES, SYSTEMS AND METHODS, and claims priority to U.S. Provisional Patent Application No. 62/359,677, filed on Jul. 7, 2016, entitled "INTELLIGENT LIGHTING CONTROL SYSTEM ELECTRICAL CONNECTOR APPARATUSES, SYSTEMS, AND METHODS," which application is incorporated herein by reference in its entirety.

TECHNICAL FIELD

The present application relates generally to the field of lighting control systems.

BACKGROUND

Customizing and automating home lighting control devices is often epitomized by the installation of unsightly lighting switches that are inundated with light switches confusingly mapped to respective fixtures. Automated home lighting control systems can also include large, complex, expensive central hubs that require expert or skilled technicians for installation and/or operation. Smart light bulbs and/or Wi-Fi enabled lightbulbs introduced into any of these contexts or even in simpler ones can disadvantageously be limited by the light switch that it is associated with and/or the lighting fixture itself. For example, if a light switch associated with a smart light bulb is switched off the smart light bulb becomes inoperable.

SUMMARY

The inventors have appreciated that various embodiments disclosed herein provide apparatuses, systems, and methods for electrically connecting components of an intelligent lighting system.

Various embodiments provide a lighting control system that includes a lighting control system including a module housing, a switch control circuit positioned in the module housing and including a processor configured to modulate a flow of electrical energy to a lighting circuit via a dimmer circuit to produce a plurality of lighting scenes. The lighting control system includes a graphical user interface coupled to the module housing and communicably coupled to the switch control circuit. The lighting control system includes a first electrical connector electrically connected to the switch control circuit and at least one of extending from and recessed in a surface of the module housing. The electrical connector includes a plurality of electrical pins. The first electrical connector is configured for a press fit engagement with a second electrical connector of a base module.

In some implementations, the first electrical connector includes at least one pair of connectors.

In some implementations, the at least one pair of connectors includes at least one of blade connectors and headers.

In some implementations, a first connector of the at least one pair of connectors is positioned on a first end of the module housing and wherein a second connector of the at least one pair of connectors is positioned on a second end of the module housing opposite the first end.

In some implementations, the first connector of the at least one pair of connectors and the second connector of the at least one pair of connectors includes blade connectors.

In some implementations, the first electrical connector is configured for power and data transmission.

In some implementations, the first electrical connector is configured to maintain contact and electrical communication with the second electrical connector within a range of 0-2 mm between contacts of the respective connectors.

In some implementations, the lighting control system includes a rechargeable battery electrically connected to the switch control circuit.

In some implementations, the electrical connector protrudes from the housing.

In some implementations, the lighting control system includes a spring biased latch extending from the module housing.

In some implementations, the graphical user interface includes a tactile display.

In some implementations, the graphical user interface is housed in a light switch actuator that is configured to move with respect to the module housing.

In some implementations, the light switch actuator is configured to pivot.

In some implementations, the light switch actuator is configured to translate.

In some implementations, the light switch actuator is composed at least in part of a glass.

In some implementations, the lighting control system includes a wireless communication module electrically coupled to the switch control circuit.

In some implementations, the lighting control system includes an antenna.

In some implementations, the lighting control system includes a camera.

In some implementations, the lighting control system includes a light sensor.

In some implementations, the lighting control system includes a thermometer

In some implementations, the lighting control system includes a humidity sensor

In some implementations, the lighting control system includes an air quality sensor.

In some implementations, the lighting control system includes a microphone.

In some implementations, wherein the base module comprises a power circuit includes one or more of a transformer, a power isolator, and an AC to DC converter.

In some implementations, wherein the base module comprises a power circuit includes a flyback converter.

In some implementations, the dimmer circuit includes at least one of a TRIAC dimmer and a MOSFET dimmer.

In some implementations, the lighting control system includes a detection circuit including at least one of a voltage sensor and a current sensor.

Various implementations provide a computer program product for operating a lighting control system. The computer program product can include a non-transitory computer-readable storage medium coupled to one or more processors and having instructions stored thereon which, when executed by the one or more processors, cause the one or more processors to perform operations for operating a lighting control system apparatus according to anyone of the preceding implementations described and/or according to anyone of the apparatuses disclosed herein.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 7A-7C illustrate connector components of a lighting control system.

The features and advantages of the inventive subject matter disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods and components of lighting control devices.

Figure 1A:
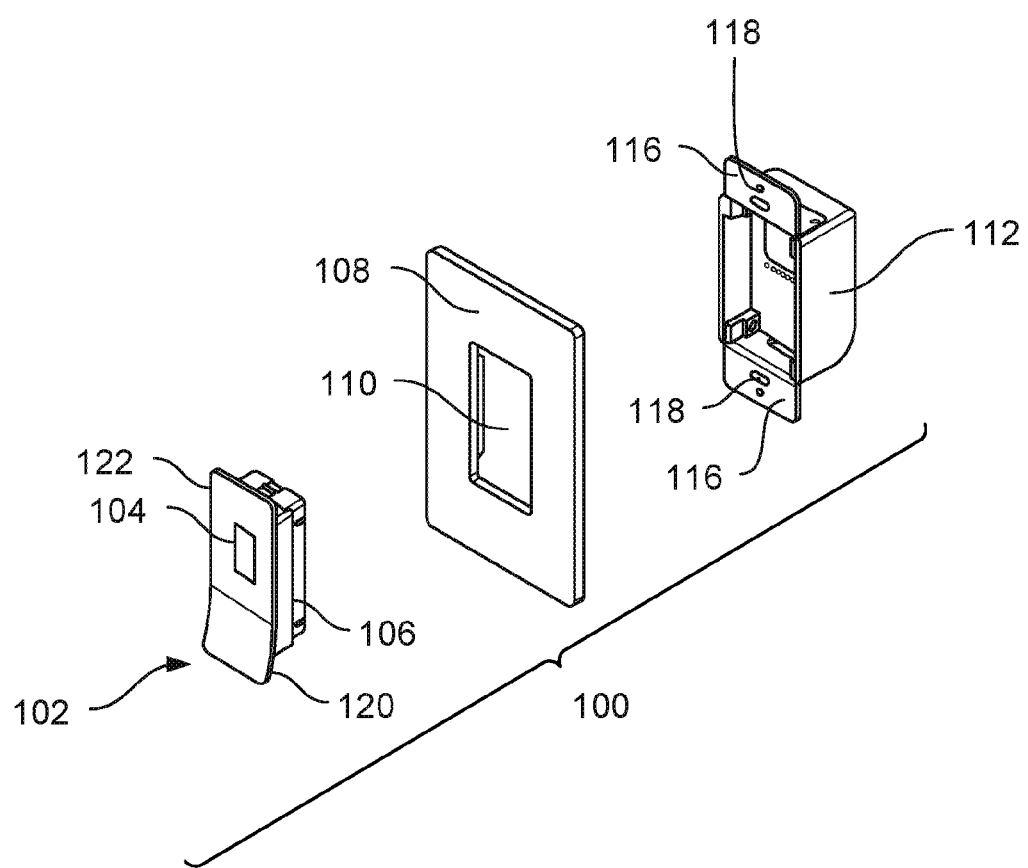
FIG. 1A is a perspective partially exploded view of a lighting control device.

FIG. 1A is a perspective partially exploded view of a lighting control device 100. The lighting control device 100 includes a switch module 102 including a light switch actuator 106 and a tactile display 104 housed in the light switch actuator 106. The lighting control device 100 also includes a wall plate cover 108 including a switch module opening 110 extending therethrough. The lighting control device 100 also includes a base module 112 configured for coupling to the switch module 102 via multi-pin socket 114. The base module 112 is sized and configured for receipt within a one-gang wall electrical box and has a volume corresponding substantially thereto. The base module 112 is configured to be coupled to a wall electrical box via connection tabs 116 and fastener apertures 118 in the connection tabs 116.

The light switch actuator 106 includes an outer actuation surface 122, which as discussed further herein may be composed of glass. The actuation surface 122 is movable, for example, by pushing on the curved foot 120 to cause the light switch actuator 106 to pivot, for example. The pivoting of the light switch actuator 106 and the actuation surface 122 causes a contact component (shown in FIG. 2) of the switch actuator 106 to move from a first position to a second position. Movement of the contact component causes a connection of an electrical flow path, for example by allowing two electrical contacts to connect or by connecting the contact component with an electrical contact. The connecting of the electrical flow path, permits electrical energy supplied by a power source connected to the base module 112 to energize or activate the tactile display 104, as discussed in further detail herein. The tactile display 104 is structured in the switch module to move contemporaneously with at least a portion of the actuation surface 122 and with the actuator 106. When activated or energized, the tactile display 104 allows a user to define or select predefined lighting settings where the lighting settings change the voltage or power supplied to one or more light fixtures. The change in power supplied to the light fixtures may include a plurality of different voltages supplied to each fixture and may be based on various parameters including, but not limited to, location, light intensity, light color, type of bulb, type of light, ambient light levels, time of day, kind of activity, room temperature, noise level, energy costs, user proximity, user identity, or various other parameters which may be specified or detected. Furthermore, the lighting control device 100 may be connected to all of the lights in a room or even in a house and can be configured to operate cooperatively with one or more other lighting control devices 100 located in a unit or room and connected to the same or distinct lighting fixtures.

Figure 1B:
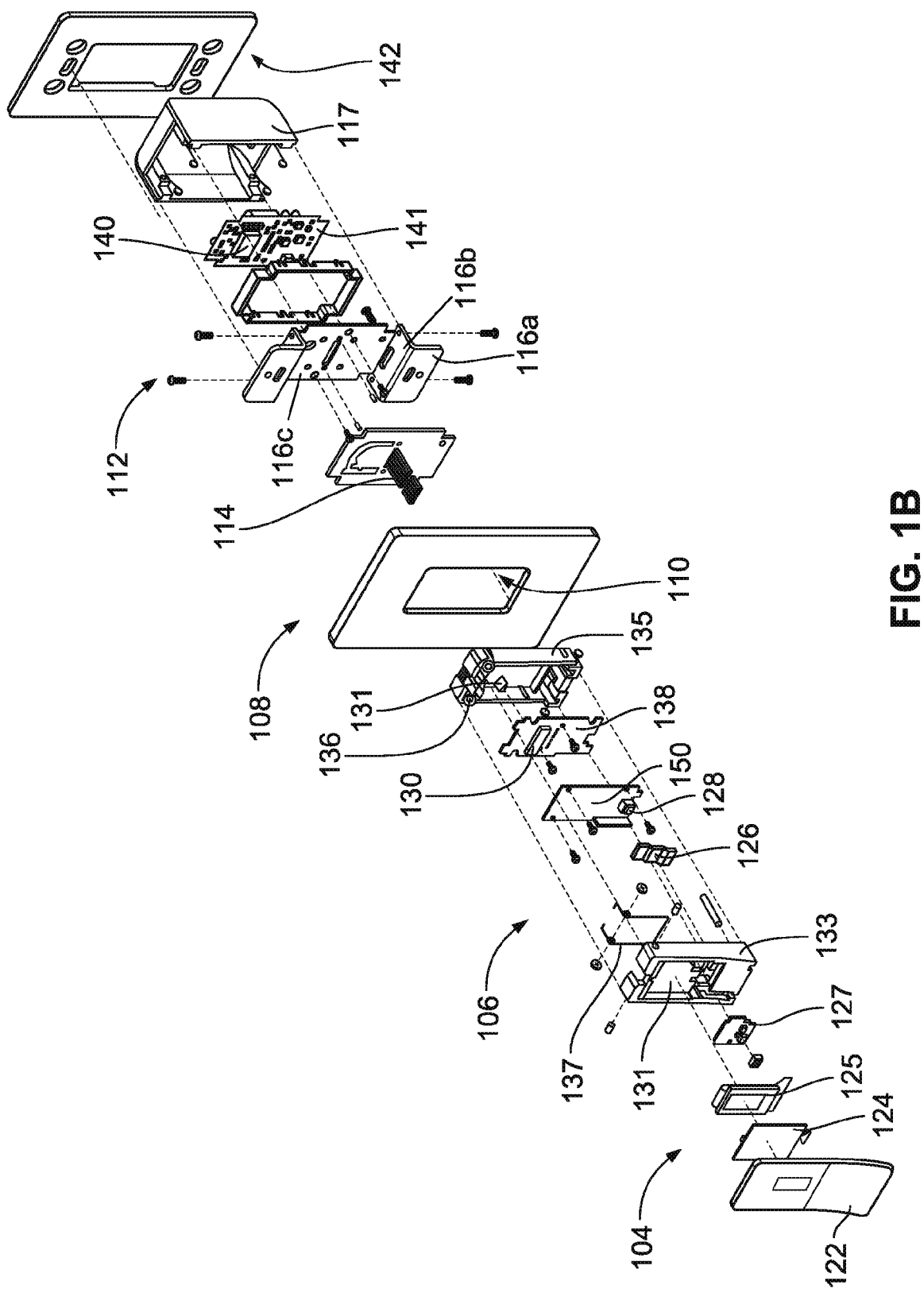
FIG. 1B is a fully exploded view of the lighting control device of FIG. 1A

FIG. 1B is a fully exploded view of the lighting control device 100 of FIG. 1A. As demonstrated in FIG. 1B, the tactile display 104 is positioned between the outer actuation surface 122 and the light switch actuator 106. The actuation surface 122 may be composed of an impact-resistant glass material permitting light from the tactile display 104 and/or a clear sight of path for sensors 127 or other lights, such as a light from light pipe 126 indicating activation to pass through the actuation surface 122. The tactile display 104 is composed of a polymer-based capacitive touch layer 124 and a light emitting diode panel 125, which are controlled via one or more modules or processors positioned on the printed circuit board 129. The tactile display 104 is housed within a recess 131 of the light switch actuator 106 beneath the actuation surface 122. The light switch actuator 106 may be formed as a thermoplastic housing including a housing cover 133 and a housing base 135. The light switch actuator housing cover 133 is pivotally connected to the housing base 135 via pins 136 and the housing cover 133 is biased with respect the housing base 135 via torsion spring 137. In particular embodiments, the light switch actuator housing cover 133 may be configured to slide or otherwise translate or rotate. The outer actuation surface 122 is biased with the switch actuator housing cover 133 and moves contemporaneously therewith in concert with the tactile display 104 housed in the cover component 133 of the light switch actuator 106. The light switch actuator 106 includes a switch pin 128 movable between positions to close an open circuit on the primary printed circuit board substrate 150, which board also houses a switch controller or processor. In certain embodiments the light switch actuator 106 may include a circuit board stack, including the primary printed circuit board substrate 150 and a secondary printed circuit board 138 The light switch actuator 106 may include a latch 136 for coupling to the base module 112 (e.g. as the light switch actuator 106 is passed through the opening 110 in the wall plate cover 108), which latch causes the light switch actuator 106 to click into place. The housing base 135 includes a multi-pin connector or plug 134 configured to engage the multi-pin socket 114 of the base module 112.

The lighting control device 100 includes a mounting chassis 142 configured to be installed to an electrical wall box. The mounting chassis 142 creates an even surface for installation of the other modules (e.g., the base module 112 and the switch module 102). Once the base module is connected to the electrical wall box via the mounting chassis 142, the wall plate cover 108 can be coupled to the mounting chassis 142 and the light switch actuator 106 can be inserted through the switch module opening 110. In particular embodiments, the wall plate cover can be coupled to the mounting chassis 142 and/or the tabs 116 of the base module via magnets. The magnets may be recessed within openings of a portion of the wall plate cover 108. As noted, the base module 112 is configured to be coupled to the mounting chassis 142 via connection tabs 116. The base module 112 is further configured to be electrically coupled to a power source (e.g., an electrical wire coming from an electrical breaker box to the electrical wall box) and to one or more light fixtures wired to the electrical box. Accordingly, the base module 112 provides an interface between a power source, the light switch actuator 106, and one or more light fixtures. The base module includes a processor 140 and a circuit board 141 for managing the power supplied by the power source and routed to the one or more light fixtures in accordance with a light setting selection identified via the light switch actuator 106 or the tactile display 104.

One or more of the processor on the printed circuit board 15038a or 138b 130 and the base module processor 140 may include wireless links for communication with one or more remote electronic device such as a mobile phone, a tablet, a laptop, another mobile computing devices, one or more other lighting control devices 100 or other electronic devices operating in a location. In certain implementations the wireless links permit communication with one or more devices including, but not limited to, smart light bulbs, thermostats, garage door openers, door locks, remote controls, televisions, security systems, security cameras, smoke detectors, video game consoles, robotic systems, or other communication enabled sensing and/or actuation devices or appliances. The wireless links may include BLUETOOTH classes, Wi-Fi, Bluetooth-low-energy, also known as BLE (BLE and BT classic are completely different protocols that just share the branding), 802.15.4, Worldwide Interoperability for Microwave Access (WiMAX), an infrared channel or satellite band. The wireless links may also include any cellular network standards used to communicate among mobile devices, including, but not limited to, standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

Figure 2A:
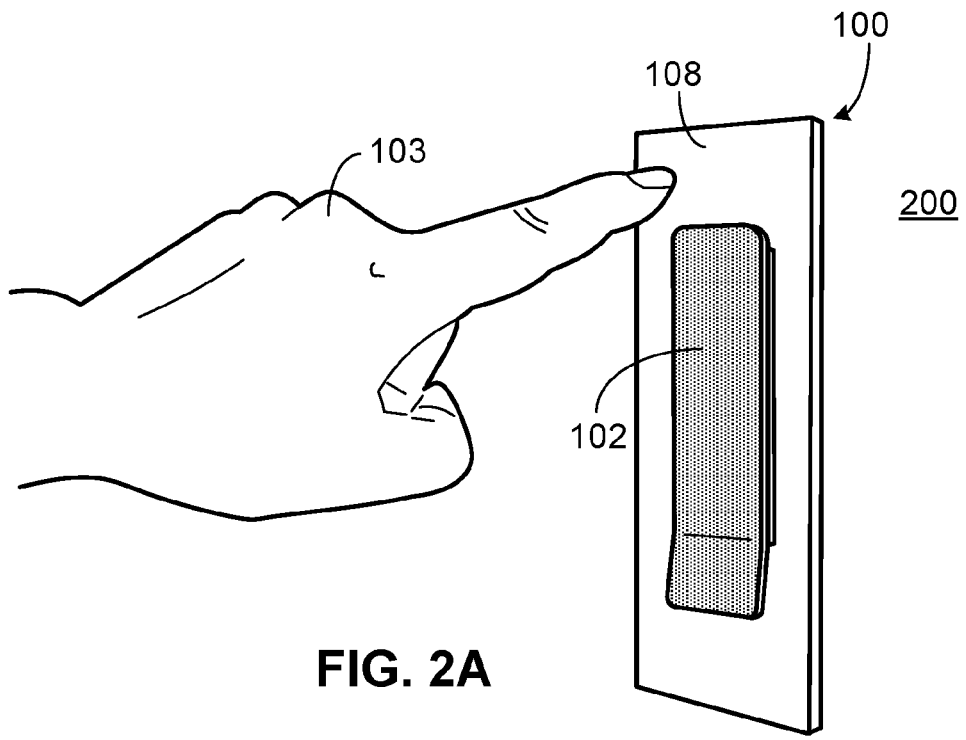
FIG. 2A shows the lighting control device of FIG. 1A mounted on a wall.

FIG. 2A shows the lighting control device 100 of FIG. 1A mounted on a wall 200. As demonstrated in FIG. 2A, the base module 112 is not visible upon installation of the lighting control device 100 in view of the wall plate cover 108. Because the wall plate cover 108 attaches to the base module 112, the wall plate cover 108 appears to be floating on the wall 200. The lighting control device 100 may be activated by a user 103 interacting with the outer actuation surface 122 and the tactile display 104.

Figure 2B:
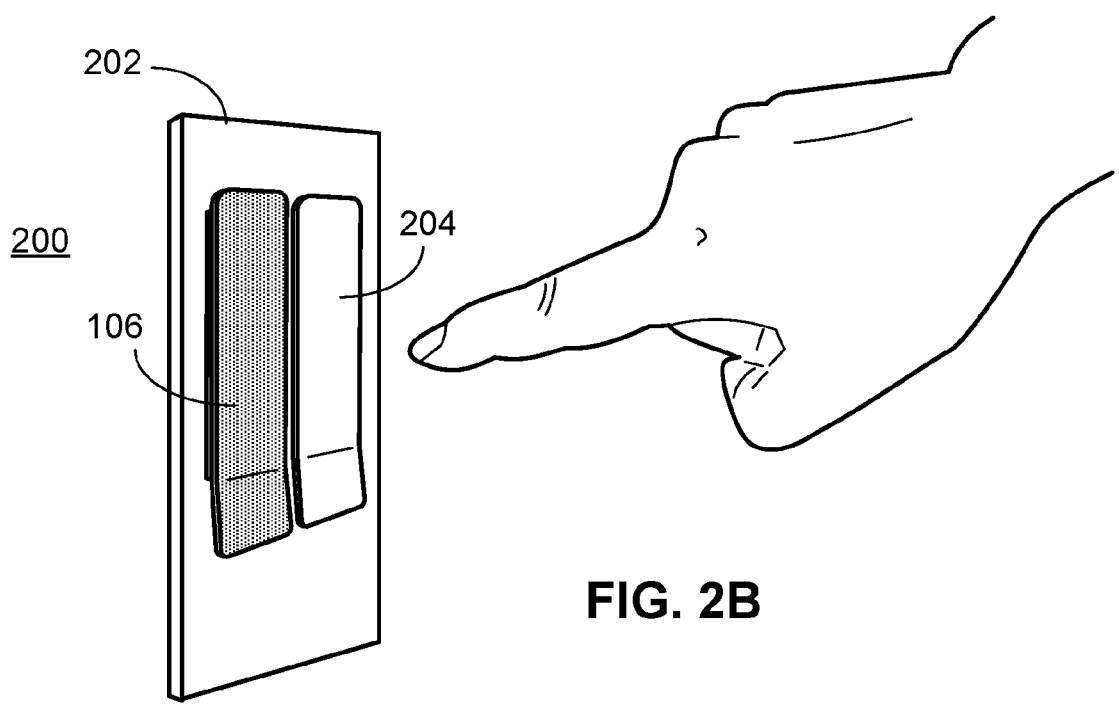
FIGS. 2B and 2C illustrate multi-switch lighting control devices.
Figure 2C:
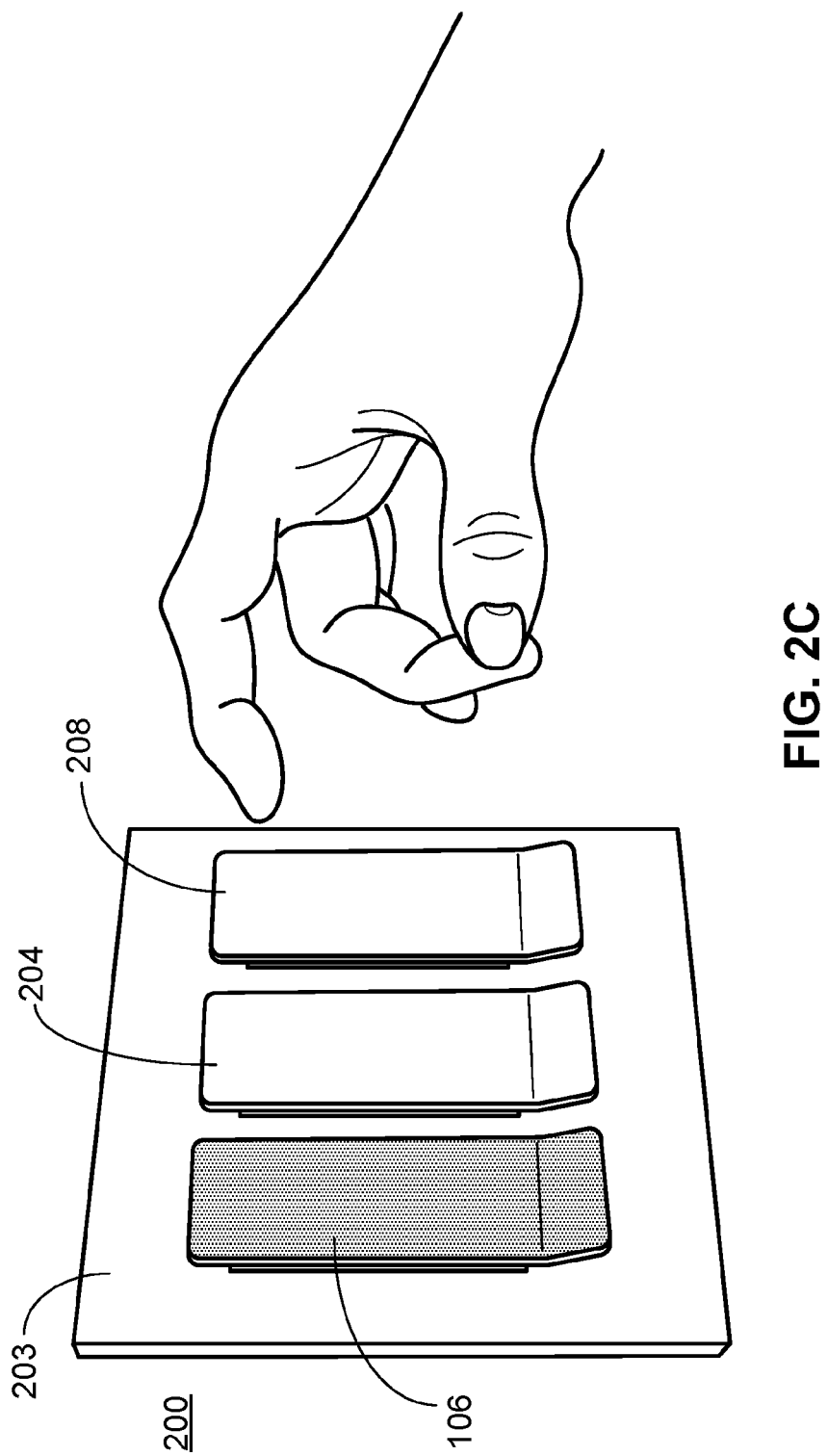

FIGS. 2B and 2C illustrate multi-switch configurations of multiple lighting control device. FIGS. 2B and 2C illustrate a two switch and three switch embodiment respectively where the lighting control devices 202 and 203 each include a light switch actuator 106 as well as auxiliary switches 204 and 208, as well as 2 and 3 base modules 112, respectively.

FIGS. 3A-3F illustrate a lighting control device transitioning through various lighting settings and a room having lighting fixtures controlled by the lighting control device.

Figure 3A:
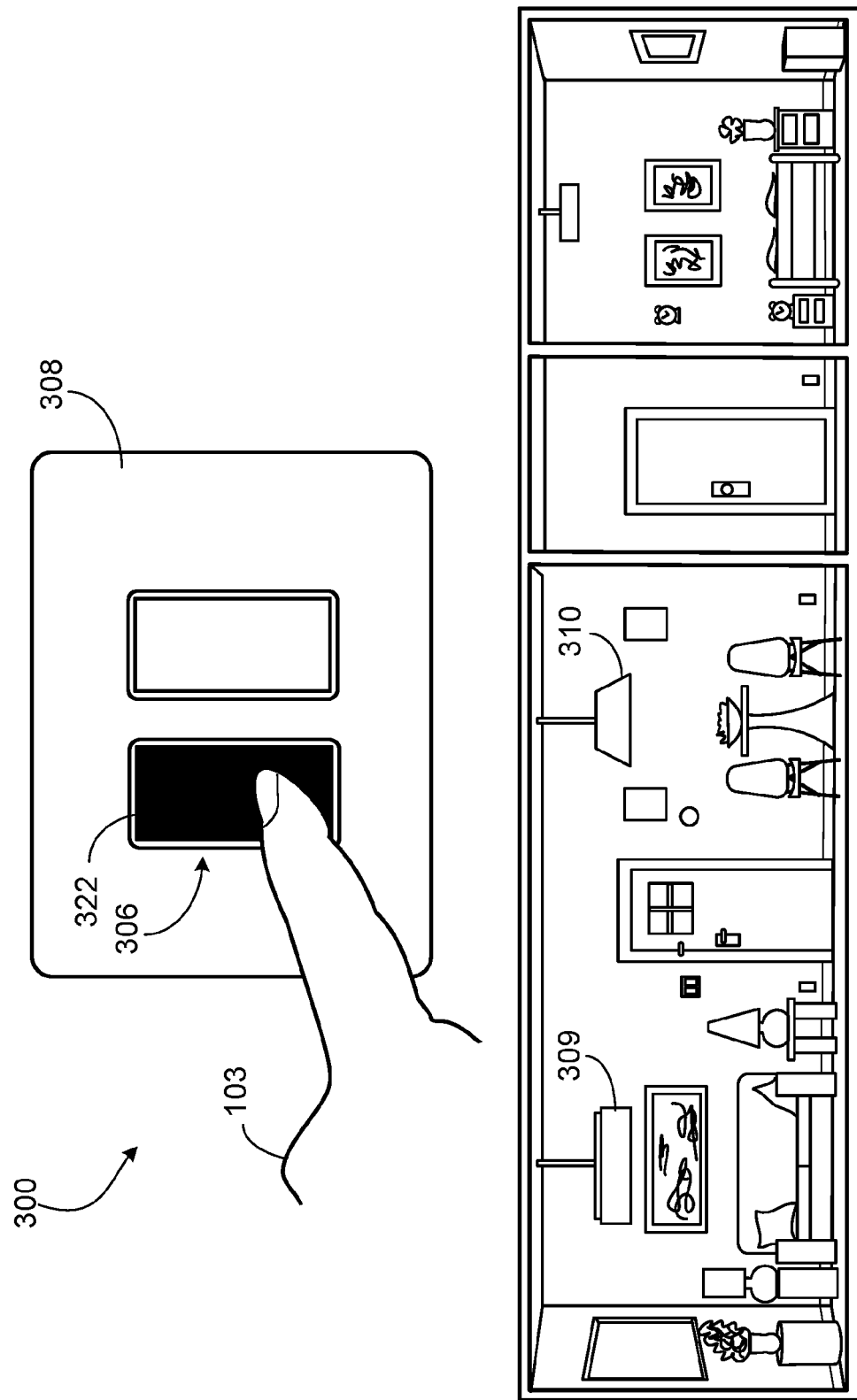
FIGS. 3A-3F illustrate a lighting control device transitioning through various lighting settings and a room having lighting fixtures controlled by the lighting control device.
Figure 3B:
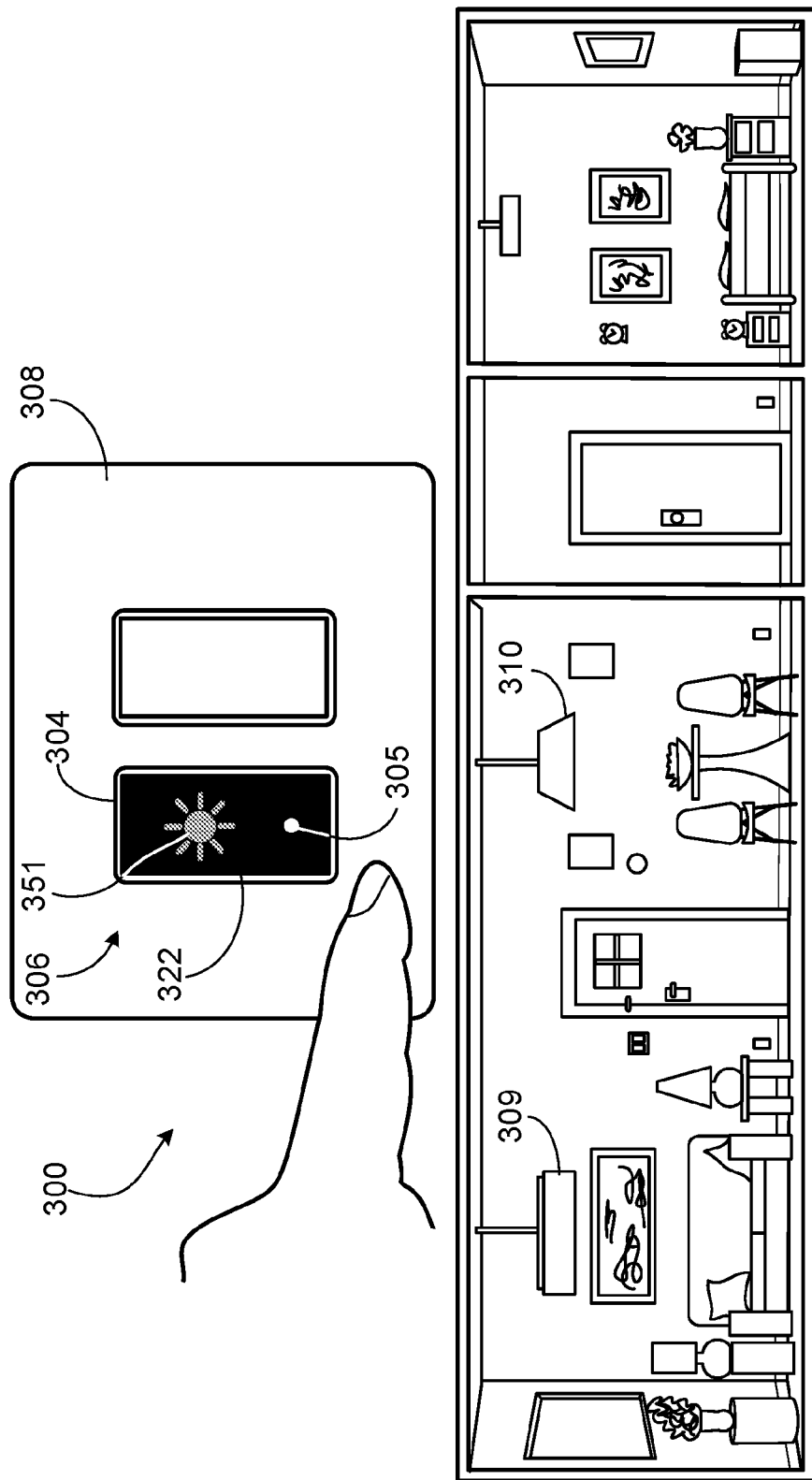
Figure 3C:
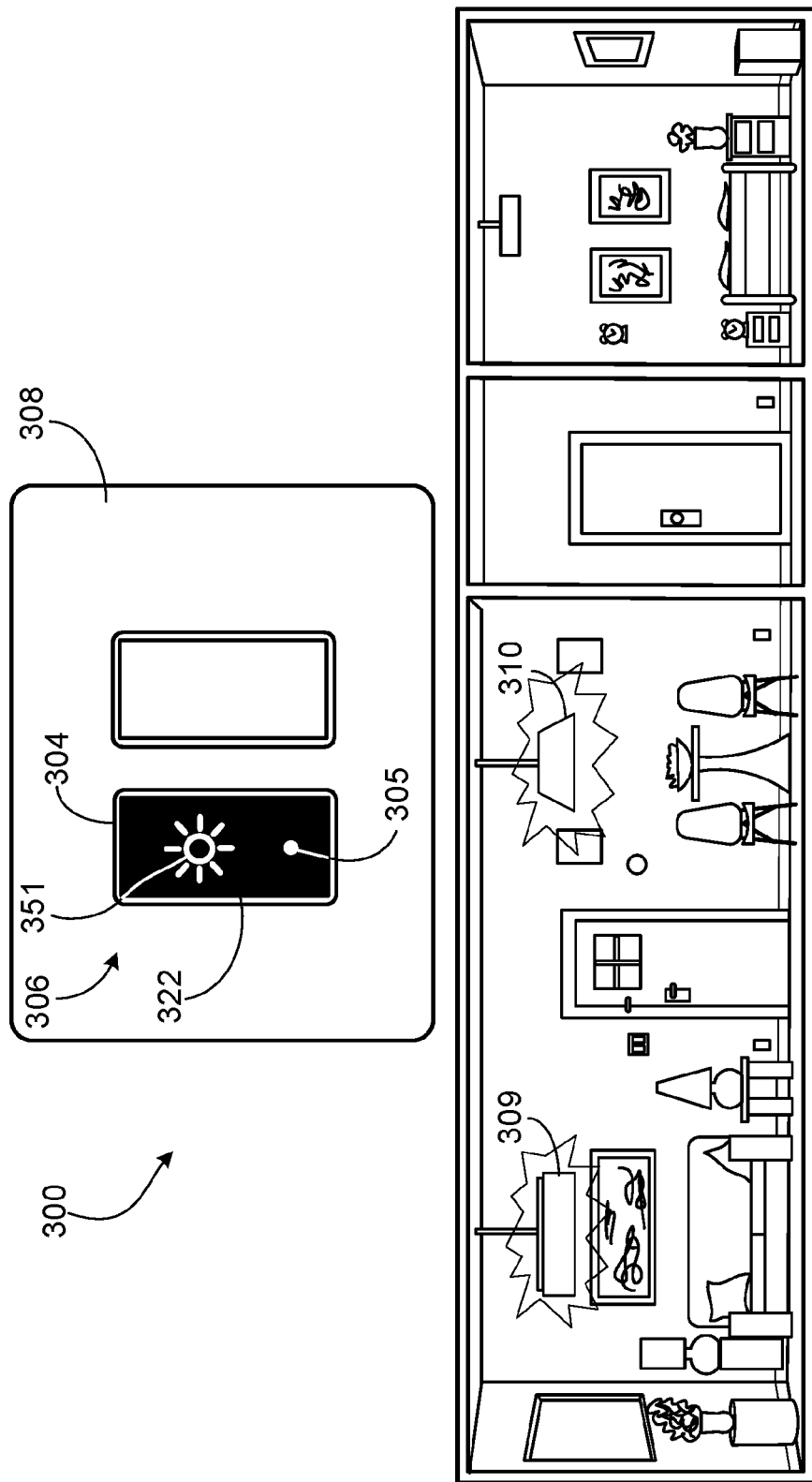
Figure 3D:
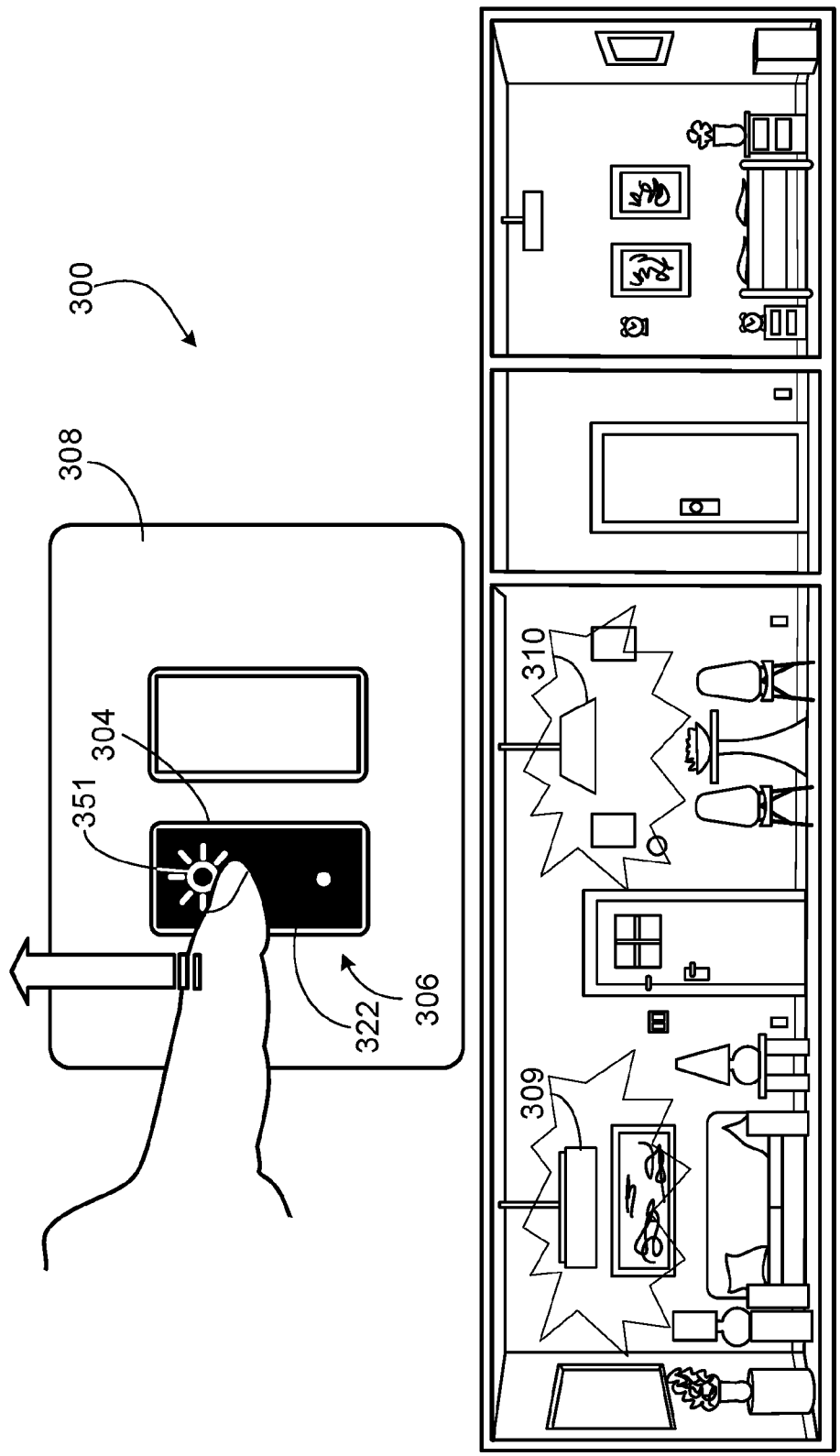
Figure 3E:
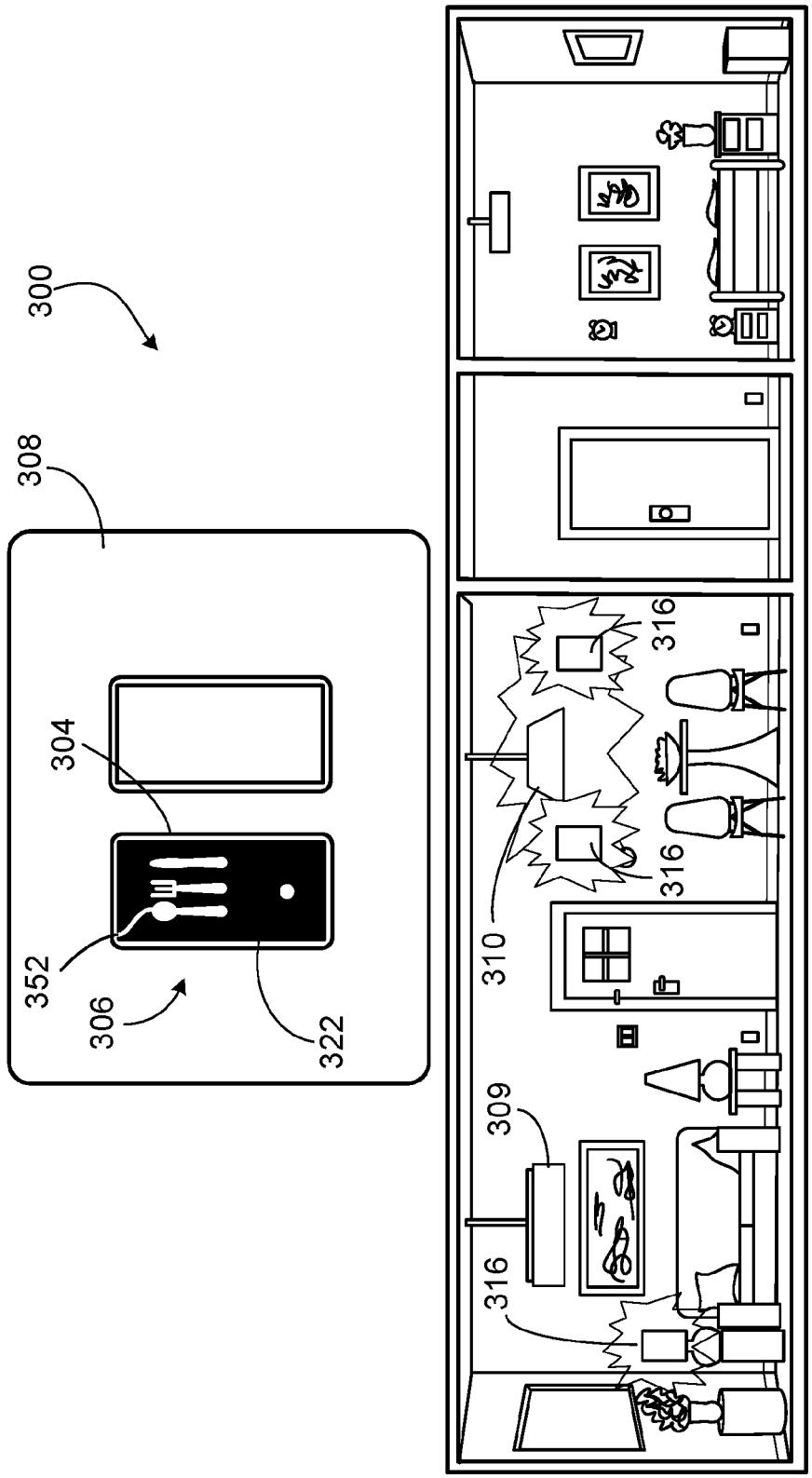
Figure 3F:
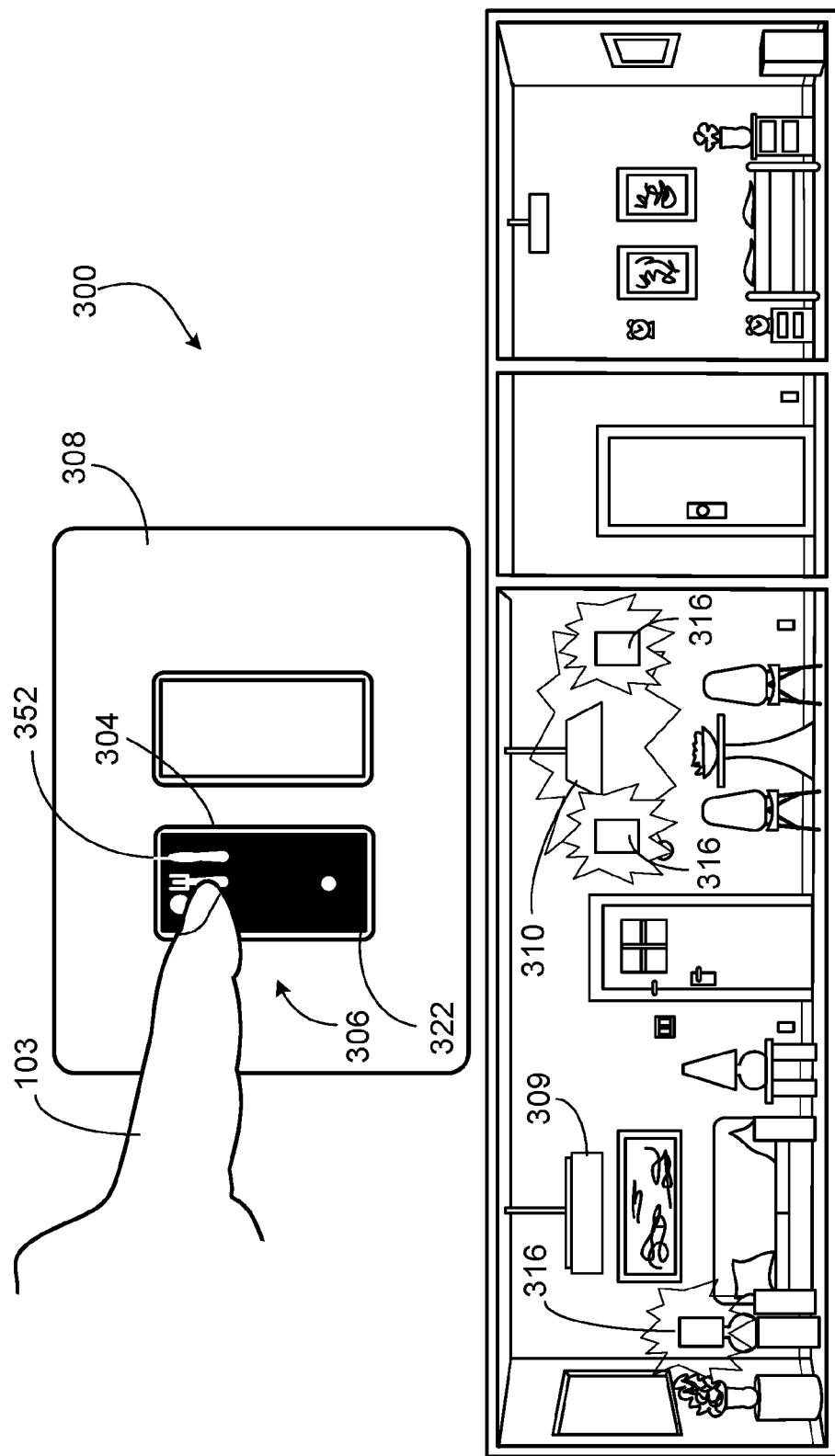

In FIG. 3A, the lighting control device 300 is connected to a base module positioned behind the wall plate 308. The lighting control device 300 includes a dynamic light switch actuator 306, operable in a manner similar to the light switch actuator discussed in connection with FIGS. 1A-2C, and an auxiliary light switch actuator. As demonstrated in FIG. 3A by the unilluminated outer actuation surface 322 of the light switch actuator 306 is inactive and not energized. In response to a user 103 moving the actuation surface 322 of the light switch actuator 306, the light switch actuator 306 begins to become energized, as shown in FIG. 3B. The energization or activation of the light switch actuator 306 is signaled by the power light indicator 305 and by full lighting setting icon 351. As shown in FIG. 3C where the icon 351 is fully lit (rather than partially lit as in FIG. 3B), the light switch actuator 306 is fully energized. In this particular configuration, the primary lights 309 and 310 are illuminated at full power. FIG. 3D shows the transition between lighting settings. As demonstrated in FIG. 3D, this transition is facilitated via user 103 completing swiping gesture 312 across the tactile display 304 and along the actuation surface 322. As the user completes the gesture 312, the icon 351 is swiped from the tactile display 304 as the tactile display toggles to a new light setting shown in FIG. 3E. The new light setting shown in FIG. 3E is represented or identified by the dinner icon 352. The new light setting shown in FIG. 3 has the light fixture 309 powered down and has caused lamp 316 and sconces 318 to become illuminated to change the lighting scene in the room. The change in the light setting causes a change in distribution of power to certain lighting fixture based on the selected lighting setting. The light switch actuator 306 may be pre-programmed with a plurality of lighting settings or may be configured with particular lighting settings as specified by the user 103. A further swiping gesture 315 shown in FIG. 3F or a different gesture are used to transition from the lighting setting of FIG. 3F represented by icon 352 to a further lighting setting.

Figure 4:
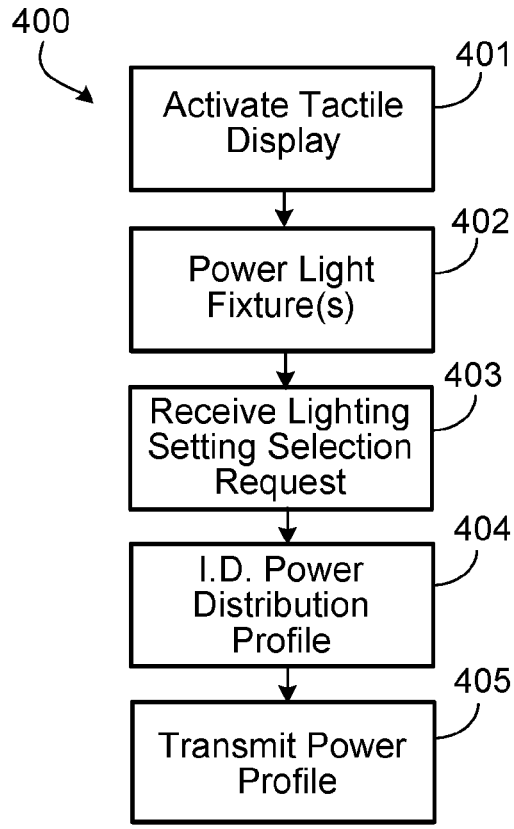
FIG. 4 provides a flow diagram of operations of a system for controlling a lighting control device.

FIG. 4 provides a flow diagram of operations of a system for controlling a lighting control device. FIG. 4 illustrates control operations of a control system, such as processor 130 configured to control the lighting control device 100 or 300, in accordance with various embodiments of the present invention. At 401, the tactile display housed in the light switch actuator is activated by moving the light switch actuator, for example by moving the actuation surface of the light switch actuator. At 402, the light fixtures electrically coupled to the light switch actuator via a base module are powered as the movement of the light switch actuator causes a contact component to move into a new position and thereby permit or cause an electrical flow path between a power source and the light fixture(s) to be closed. The tactile display housed in the light switch actuator is moved contemporaneously with the actuation surface. At 403, a lighting setting selection request is received via the tactile display, for example by a particular motion or motions on the tactile display. The lighting setting selection request identifies a lighting setting from among a plurality of lighting settings. A user may swipe multiple times to toggle through the plurality of lighting settings or may conduct a specific motion that corresponds to a particular lighting setting including, but not limited to, a half swipe and tap to achieve a light intensity of all the connected light fixtures at half of their peak output. The lighting settings identify distinct power distribution schemes for one or more light fixtures connected to the light switch module. At 404, a power distribution scheme is identified. At 405, the identified power distribution scheme is transmitted, for example by the base module responding to control signals from the light switch actuator, to adjust one, some, or all of the lights based on the power distribution scheme corresponding to the lighting setting selected. The power distribution schemes or profiles may be stored in a memory device of the lighting control device. In certain embodiments, the power distribution schemes may be adjusted to account for other parameters such as ambient lighting from natural light or an unconnected source. In certain embodiments the power distribution schemes may be adjusted based on one or more other sensor parameters. In particular embodiments, the lighting setting may be adjusted by automation based on time of day, sensed parameters such as light, temperature, noise, or activation of other devices including, but not limited to, any electronic device described herein.

Figure 5:
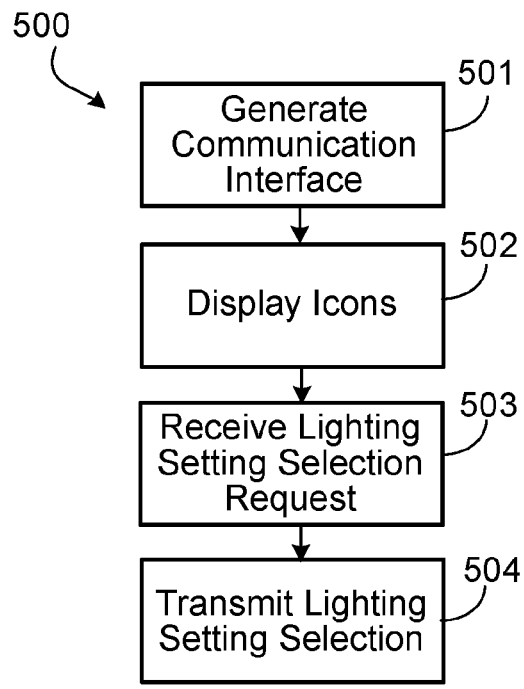
FIG. 5 shows a flow diagram of a system for remotely operating a lighting control device.

FIG. 5 shows a flow diagram of system for remotely operating a lighting control device. In particular embodiments, the lighting control device 100 or 300 may be operable from a remote device if the actuator switch is activated or energized. In such instances, the remote device may include one or more computer program applications, such as system 500, operating on the device to communicate with and control the lighting control device. Accordingly, at 501, the control system 500 initiates a connection module to generate a communication interface between a mobile electronic device and a light switch module. The connection module may cause the remote device to send one or more wireless transmission to the lighting control device via a communication protocol. At 502, the control system 500 causes the remote device to generate a display of icons on a display device of the mobile electronic device to facilitate selection of a lighting setting. At 503, the control system 500 receives a lighting setting selection based on the user selecting a particular icon. At 504, a transmission module causes the lighting setting selected to be transmitted to the lighting control device so that the light switch module and/or the base module can cause the power distribution scheme corresponding to the lighting setting to be transmitted to the lighting fixtures. The tactile display of the lighting control device may be updated in concert with receipt of the lighting setting to display the icon selected on the mobile electronic device and corresponding to the lighting setting selected on the tactile device.

Figure 6:
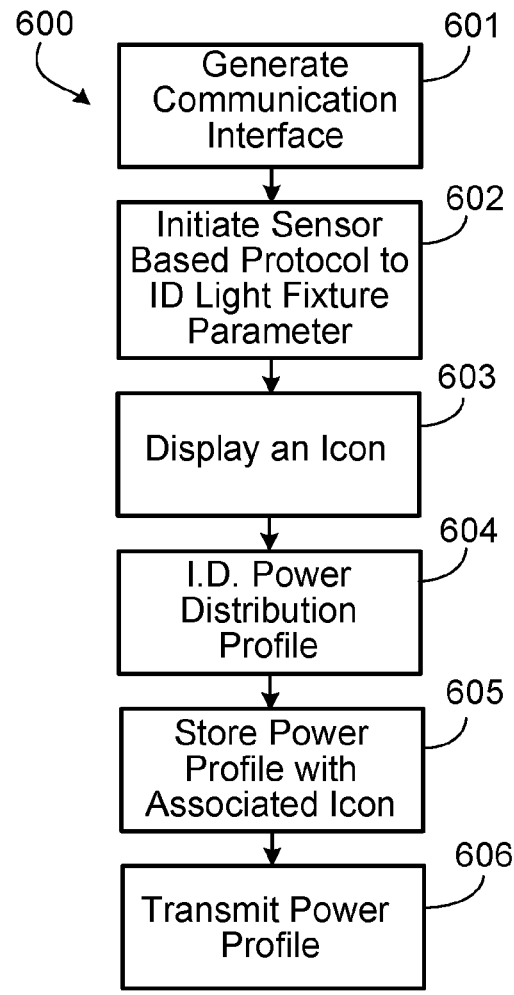
FIG. 6 illustrates a flow diagram of a system for remotely configuring operations of a lighting control device.

FIG. 6 illustrates a flow diagram of a system for remotely configuring operations of a lighting control device. The remote device may include devices including, but not limited to, a mobile phone, a mobile computing device or a computing device remote from the light control device. At 601, the mobile electronic device generates a communication interface with the light switch module. At 602 a light fixture identification module initiates a sensor based protocol to identify a parameter associated with one or more light fixtures connected to the light switch control module. At 603, a display selection module causes a display of an icon to appear on a display device of the mobile electronic device. At 604, a lighting setting configuration module allows a user to create a power distribution scheme or profile for the light fixtures identified based on the identified parameters and a user specified input related to light intensity. At 604, a storage module is used to the store the power distribution scheme and associate a particular lighting setting icon with the power distribution scheme. At 605, a transmission module transmits the power distribution scheme and the associated icon to the light switch control module.

FIGS. 7A-7C illustrate connector components of a lighting control system. FIG. 7A shows a back perspective view of a switch controller 702. FIG. 7B shows a front view of a base module 712 and FIG. 7B shows a perspective view of the base module 712. The switch controller includes a switch control circuit electrically coupled to the switch electrical connector 731. The switch electrical connector 731 includes electrical contacts configured for input and output of data and power. The switch electrical connector 731 includes electrical contacts positioned at a top surface and a bottom surface of the module housing of the switch controller 702. The electrical contacts can include blade connectors or headers. The switch electrical connector 731 is configured to matingly engage with the base electrical connector 714. In certain embodiments, the switch electrical connector 731 can include a male connector while the base electrical connector 714 can include a female connector. In certain embodiments, the switch controller 702 may request a user identification in response to a connection of the switch electrical connector 731 with the base electrical connector 714. The switch controller 702 includes a tab 736 configured to engage with a spring loaded mechanical lock 751 positioned in the well 716 of the base module 712. The engagement of tab 736 with the spring loaded mechanical lock 751 helps to securely keep the switch controller 702 nested in the well 716 of the base module 712. In certain embodiments, the tab 736 can be spring loaded. The base electrical connector 714 and the switch electrical connector 731 can be configured to maintain electrical communication with small tolerances of space between them, for example with a 2 mm space between them. The switch controller 702 can include a rechargeable battery housed therein. The rechargeable battery may be recharged when the base electrical connector 714 and the switch electrical connector 731 are engaged. The base module 712 and the switch controller 702 can be configured with electrical components such as those discussed in further detail in connection with the lighting control system 800 of FIG. 8. The electrical connection between the switch controller 702 facilitates communication between the processors or controllers in each of the base module 712 and the switch controller 702 and also transfers power from the base module 712 to the switch controller 702 for powering the components in the switch controller. In particular, the electrical connection between the base electrical connector 714 and the switch electrical connector 731, permit commands related to lighting scene selections received at the switch controller to be transmitted to the base module 712 for adjusting components of a dimming circuit to achieve the lighting scene selected.

Figure 8:
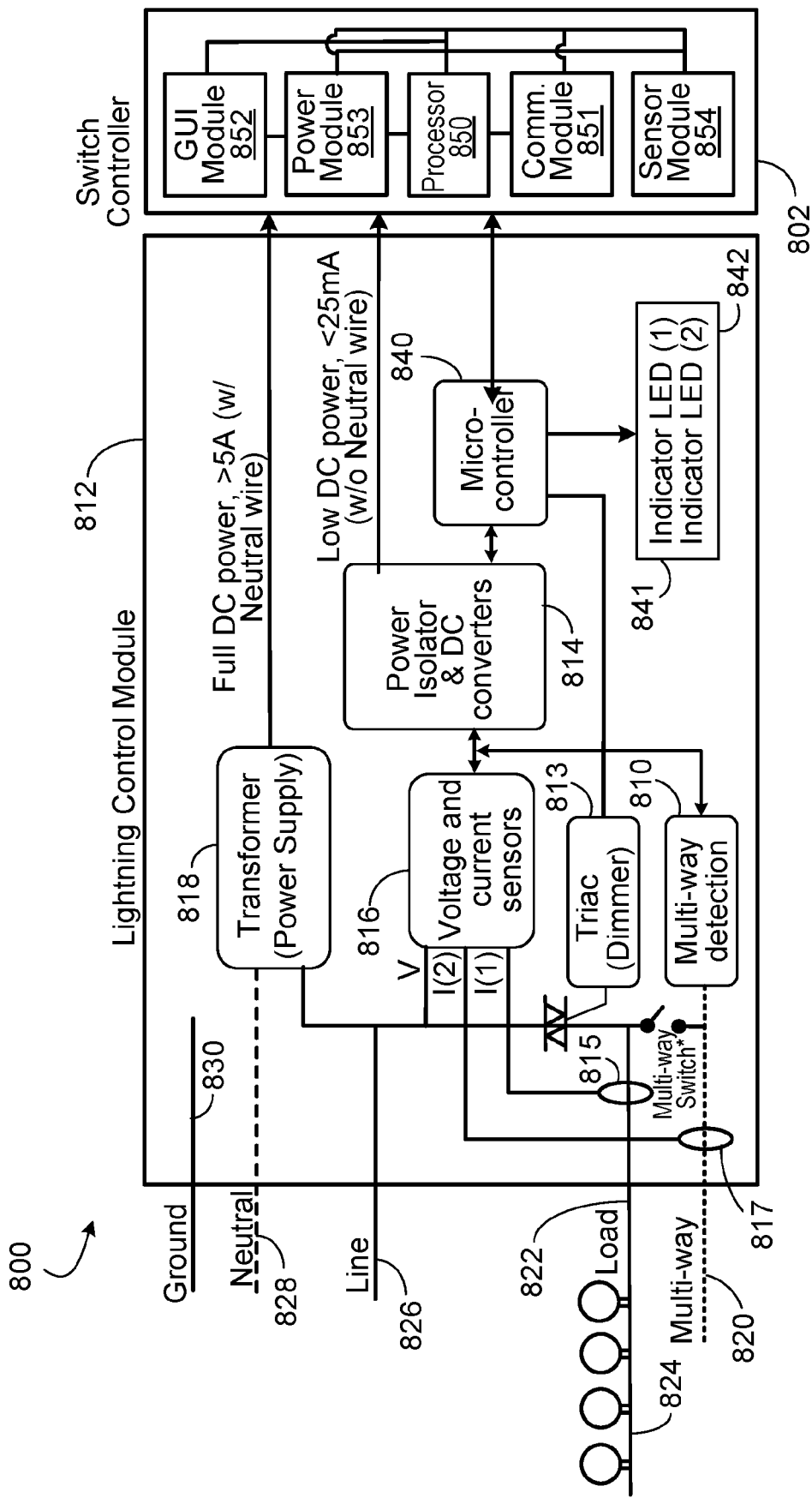
FIG. 8 is a schematic of a lighting control system.

FIG. 8 is a schematics of the lighting control system 800 configured to execute lighting control operations described herein. The lighting control system 800 is depicted separated into a base lighting control module 812 (which may be configured in a manner similar to base module 112) and a switch module or switch controller 802 (which may be configured in a manner similar to switch module 102). As described herein, the switch module 802 can include a tactile interface, operable via the graphical user interface module 852, and a switch actuator, such as the tactile display 104 and the light switch actuator 106 described herein. The switch module 802 houses a processor 850, which may be configured to send commands to microcontroller 840 and receive inputs from the microntroller 840 to control the operation of a transformer 818, a power isolator and an AC to DC converter 814 (which may include a flyback converter), and a dimmer, such as a TRIAC dimmer 813, a voltage and current sensor 816. In some embodiments, the base lighting control module 812 may include a MOSFET dimmer. The power isolator 814 separates the analog AC current from the low power or DC digital components in the base lighting control module 812 and the switch module 802. The power isolate 814 may provide power inputs to the switch control module 802 via a power module 853. Power module 853 includes power circuitry configured to regulate the flow of power from the base module 812 to the switch controller module 802 including directing power to one or more of the modules in the switch controller module 802. The switch module 802 also houses a communication module, which can include one or more antennae or other wireless communication modules. The switch module 802 also houses a sensor module, which can include one or more sensors, such as a light sensor, a camera, a microphone, a thermometer, a humidity sensor, and an air quality sensor. The processor 850, is communicably coupled with one or more modules in the switch module 802 to control the operation of and receive inputs from those modules, for example to control modulation of the flow of electrical energy to a lighting circuit of a light fixture 824 connected to the base lighting control module 812.

The base lighting control module 812 includes a ground terminal 830 for grounding various electrical components contained in the module 812. The base light control module 812 includes a neutral terminal 828 for connecting to a neutral wire, a line terminal 826, and a load terminal 822. As shown in FIG. 8, the voltage and current sensor(s) are coupled to the load line to detect changes in the voltage or current along the line carrying power to one or more light fixtures 824 connected to the lighting circuit (750). The base lighting control module 812 also includes a controller 840 communicably coupled to the processor 850. The base lighting control module 812 also includes LED indicator lights 842 and 841 for indicating information regarding the status of the base lighting control module 812. For example, in some embodiments LED indicator light 841 can indicates if a neutral wire is connected while LED indicator light 842 can indicate if a 3 way connection is connected.

Implementations of the subject matter and the operations described in this specification can be implemented by digital electronic circuitry, or via computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Implementations of the subject matter described in this specification can be implemented in a computing system that includes a back end component, e.g., as a data server, or that includes a middleware component, e.g., an application server, or that includes a front end component, e.g., a user computer having a graphical display or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some implementations, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary implementations, and that such variations are intended to be encompassed by the present disclosure. It is recognized that features of the disclosed implementations can be incorporated into other disclosed implementations.

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

The claims should not be read as limited to the described order or elements unless stated to that effect. It should be understood that various changes in form and detail may be made by one of ordinary skill in the art without departing from the spirit and scope of the appended claims. All implementations that come within the spirit and scope of the following claims and equivalents thereto are claimed.

What is claimed is:

1. A lighting control system comprising:
   a base module having a well;
   a switch controller positioned and removably secured in the well of the base module, the switch controller including a processor configured to modulate a flow of electrical energy to a lighting circuit using a dimmer circuit to produce a plurality of lighting scenes;
   a graphical user interface mechanically and communicably coupled to the switch controller, wherein the graphical user interface is housed in a light switch actuator configured to pivot with respect to the base module; and
   a first electrical connector electrically connected to the switch controller and one of extending from and recessed in a surface of the well, the first electrical connector configured for a press fit engagement with a second electrical connector of the base module.

2. The lighting control system according to claim 1, wherein the first electrical connector includes a pair of connectors.

3. The lighting control system according to claim 2, wherein the pair of connectors include one or more blade connectors.

4. The lighting control system according to claim 2, wherein each connector of the pair of connectors is positioned an opposite end of the well of the base module.

5. The lighting control system according to claim 1, wherein the first electrical connector includes one or more blade connectors.

6. The lighting control system according to claim 1, wherein the first electrical connector is configured for power and data transmission.

7. The lighting control system according to claim 1, wherein the first electrical connector is configured to maintain contact and electrical communication with the second electrical connector within a tolerance of 2 mm between contacts of the respective connectors.

8. The lighting control system according to claim 1, further comprising a rechargeable battery included in the switch controller.

9. The lighting control system according to claim 1, wherein the second electrical connector protrudes from the well of the base module.

10. The lighting control system according to claim 1, further comprising a spring biased latch included in the well of the base module to secure the switch controller.

11. The lighting control system according to claim 1, wherein the graphical user interface includes a tactile display.

12. The lighting control system according to claim 1, wherein the light switch actuator is configured to translate.

13. The lighting control system according to claim 1, wherein the light switch actuator is composed at least in part of glass.

14. The lighting control system according to claim 1, further comprising a wireless communication module included in the switch controller.

15. The lighting control system according to claim 1, further comprising a camera.

16. The lighting control system according to claim 1, further comprising a light sensor.

17. The lighting control system according to claim 1, further comprising a thermometer.

18. The lighting control system according to claim 1, further comprising a humidity sensor.

19. The lighting control system according to claim 1, further comprising an air quality sensor.

20. The lighting control system according to claim 1, further comprising a microphone.

21. The lighting control system according to claim 1, wherein the base module comprises a power circuit having one of a transformer, a power isolator, and an AC to DC converter to power the switch controller.

22. The lighting control system according to claim 1, wherein the base module comprises a power circuit including a flyback converter to power the switch controller.

23. The lighting control system according to claim 1, wherein the dimmer circuit includes a MOSFET dimmer.

24. An apparatus comprising:
    a first module configured to fit in a wall electrical box, the first module having a well including a spring-loaded stop and a first connector;
    a second module removably secured in the well using the spring-loaded stop, the second module including a second connector press fit to the first connector to conduct power; and
    a processor included in the second module and powered by the first module, the processor configured to modulate a flow of electrical energy to a lighting circuit using a dimmer circuit to produce a to lighting scene according to input on a graphical user interface mechanically and communicably coupled to the second module, wherein the graphical user interface is housed in a light switch actuator configured to pivot with respect to the first module.

25. A system comprising:
    a first module configured to fit in a wall electrical box, the first module having a well including a spring-loaded stop and a female connector;
    a second module having a tab to removably secure the second module in the well using the spring-loaded stop, the second module including a blade connector configured to mate with the female connector when the second module is secured in the well; and
    a processor included in the second module and powered by the first to module, the processor configured to modulate a flow of electrical energy to a lighting circuit using a dimmer circuit to produce a lighting scene according to input on a graphical user interface mechanically and communicably coupled to the second module, wherein the graphical user interface is housed in a light switch actuator configured to pivot with respect to the first module.

* * * * *